(12) United States Patent
Chopra

(10) Patent No.: US 8,069,385 B1
(45) Date of Patent: Nov. 29, 2011

(54) PROGRAMMABLE BUILT-IN SELF-TEST ARCHITECTURE

(75) Inventor: Rajesh Chopra, Pleasanton, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 116 days.

(21) Appl. No.: 12/501,995

(22) Filed: Jul. 13, 2009

Related U.S. Application Data

(60) Provisional application No. 61/080,623, filed on Jul. 14, 2008.

(51) Int. Cl.
G11C 29/44 (2006.01)
G11C 29/54 (2006.01)

(52) U.S. Cl. .............................. 714/723; 714/733

(58) Field of Classification Search ................. None
See application file for complete search history.

(56) References Cited

U.S. PATENT DOCUMENTS

| | | | |
|---|---|---|---|
| 4,868,735 A * | 9/1989 | Moller et al. | 712/234 |
| 5,155,852 A * | 10/1992 | Murakami et al. | 718/100 |
| 5,365,481 A * | 11/1994 | Sawada | 365/201 |
| 5,404,553 A * | 4/1995 | Komori et al. | 712/25 |
| 5,640,509 A * | 6/1997 | Balmer et al. | 714/42 |
| 6,560,740 B1 * | 5/2003 | Zuraski et al. | 714/733 |
| 6,611,452 B1 | 8/2003 | Han | |
| 6,721,220 B2 | 4/2004 | Yoon | |
| 6,734,815 B1 | 5/2004 | Abdollahi-Alibeik | |
| 6,735,113 B2 | 5/2004 | Yoon | |
| 6,756,838 B1 | 6/2004 | Wu | |
| 6,771,554 B1 * | 8/2004 | Lazar | 365/222 |
| 6,778,435 B1 | 8/2004 | Han | |
| 6,781,888 B1 | 8/2004 | Horch | |
| 6,785,169 B1 | 8/2004 | Nemati | |
| 6,804,162 B1 | 10/2004 | Eldridge | |
| 6,885,581 B2 | 4/2005 | Nemati | |
| 6,891,774 B1 | 5/2005 | Abdollahi-Alibeik | |
| 6,903,987 B2 | 6/2005 | Yoon | |
| 6,937,085 B1 | 8/2005 | Samaddar | |
| 6,940,772 B1 | 9/2005 | Horch | |
| 6,944,051 B1 | 9/2005 | Lee | |
| 6,947,349 B1 | 9/2005 | Abdollahi-Alibeik | |
| 6,958,931 B1 | 10/2005 | Yoon | |
| 7,054,191 B1 | 5/2006 | Gupta | |
| 7,089,439 B1 | 8/2006 | Abdollahi-Alibeik | |
| 7,096,144 B1 | 8/2006 | Bateman | |
| 7,187,530 B2 | 3/2007 | Salling | |
| 7,268,373 B1 | 9/2007 | Gupta | |
| 7,304,327 B1 | 12/2007 | Nemati | |
| 7,319,622 B1 * | 1/2008 | Roy | 365/189.11 |
| 7,379,381 B1 | 5/2008 | Roy | |
| 7,460,395 B1 | 12/2008 | Cho | |
| 7,464,282 B1 | 12/2008 | Abdollahi-Alibeik | |
| 7,573,077 B1 | 8/2009 | Ershov | |

(Continued)

*Primary Examiner* — Jeffrey A Gaffin
*Assistant Examiner* — Dipakkumar Gandhi
(74) *Attorney, Agent, or Firm* — The Webostad Firm

(57) ABSTRACT

A PBIST architecture is described. A data path circuit is configured for bit-to-associated bit comparisons of expected result data read from a tile with the expected result data read from result memory. The data path circuit is configured to write a first type of failure indication to first failure memory responsive to a data 0 being read from the result memory and a data 1 being read from the tile for a bit-to-associated bit comparison failure. The data path circuit is further configured to write a second type of failure indication to second failure memory responsive to a data 1 being read from the result memory and a data 0 being read from the tile for the bit-to-associated bit comparison.

14 Claims, 7 Drawing Sheets

U.S. PATENT DOCUMENTS

| | | | |
|---|---|---|---|
| 2002/0152351 A1* | 10/2002 | Tanaka | 711/105 |
| 2004/0004880 A1 | 1/2004 | Yoon | |
| 2004/0022109 A1 | 2/2004 | Yoon | |
| 2004/0071013 A1 | 4/2004 | Yoon | |
| 2005/0185489 A1 | 8/2005 | Nemati | |
| 2006/0139996 A1 | 6/2006 | Nemati | |

* cited by examiner

| Row | Number of bits | Description |
|---|---|---|
| A | 11:0 | Start Address |
| B | 11:0 | Mask for Start Address |
| C | 1 | This bit is only valid for outer loops<br>0: Disable DATA == ADDR<br>1: Enable DATA == ADDR |
| D | 1 | 0: Decrement address<br>1: Increment address |
| E | 11:0 | Step size |
| F | 15:0 | Number of Steps |

```
        ┌ Loop11                                    ← 300
        │     2 Access instructions
        │     Loop12
  310 ┤           4 Access instructions
        │     End Loop12
        │     2 Access instructions
        └ End Loop11
        ┌ Loop21
        │     2 Access instructions
        │     Loop22
        │           2 Access instructions
        │           Loop23
        │                 2 Access instructions
        │                 Loop24
  320 ┤                       4 Access instructions
        │                 End Loop24
        │                 2 Access instructions
        │           End Loop23
        │           2 Access instructions
        │     End Loop22
        │     2 Access instructions
        └ End Loop21
        ┌ Loop31
        │     2 Access instructions
        │     Loop32
        │           2 Access instructions
        │           Loop33
        │                 2 Access instructions
        │                 Loop34
  330 ┤                       4 Access instructions
        │                 End Loop34
        │                 2 Access instructions
        │           End Loop33
        │           2 Access instructions
        │     End Loop32
        │     2 Access instructions
        └ End Loop31
        ┌ Loop41
        │     2 Access instructions
        │     Loop42
  340 ┤           4 Access instructions
        │     End Loop42
        │     2 Access instructions
        └ End Loop41
```

FIG. 3

| Row | Instruction Opcode bits | Description |
|---|---|---|
| A | 0 | Valid instruction<br>0: Invalid Instruction<br>1: Valid Instruction |
| B | 1 | Enable (Port A)<br>0: No Read/Write (Port A)<br>1: Read/Write (Port A) |
| C | 2 | RNW (Port A)<br>0: If Enable, Write Op<br>1: If Enable, Read Op |
| D | 3 | Read Port B<br>0: Don't Read port B<br>1: Read Port B |
| E | 5:4 | Address is of which loop (Port A & B)<br>For 2 loop X0: Loop11, X1: Loop12<br>For 4 loop 00: Loop21, 01: Loop22, 10: Loop23, 11:Loop24 |
| F | 6 | 0: Execute instruction once<br>1: Execute instruction "CNTR" times |
| G | 7 | Invert Address (Port A)<br>0: Don't Invert<br>1: Invert |
| H | 8 | Dummy Read (Port A)<br>0: Read STROBE<br>1: Read NO STROBE |
| J | 10:9 | "X" Value |
| K | 11 | For Writes:    if(!(Current_address & AND_Val))<br>0: No invert<br>1: Invert |
| L | 12 | For Writes:    Invert data<br>0: Don't Invert<br>1: Invert<br>For Reads:    Invert Address (Port B)<br>0: Don't Invert<br>1: Invert |
| M | 13 | Dummy Read (Port B)<br>0: Read STROBE<br>1: Read NO STROBE |
| N | 15:14 | Write Data register (Port A)<br>00: DR0<br>01:DR1<br>10:DR2<br>11:DR3 |
| P | 16 | 0: Add current address pointer with "X"<br>1: Subtract current address pointer with "X" |
| R | 17 | If set add current loop with pointer pointed by Row "E" |

```
loop11_saddr, loop11_saddr_mask, loop11_nu, loop11_step_info, loop11_cnt_value,
loop12_saddr, loop12_saddr_mask, loop12_nu, loop12_step_info, loop12_cnt_value,
acc1_inst07, acc1_inst06, acc1_inst05, acc1_inst04, acc1_inst03,
acc1_inst02, acc1_inst01, acc1_inst00,
loop21_saddr, loop21_saddr_mask, loop21_nu, loop21_step_info, loop21_cnt_value,
loop22_saddr, loop22_saddr_mask, loop22_nu, loop22_step_info, loop22_cnt_value,
loop23_saddr, loop23_saddr_mask, loop23_nu, loop23_step_info, loop23_cnt_value,
loop24_saddr, loop24_saddr_mask, loop24_nu, loop24_step_info, loop24_cnt_value,
acc2_inst15, acc2_inst14, acc2_inst13, acc2_inst12, acc2_inst11,
acc2_inst10, acc2_inst09, acc2_inst08, acc2_inst07, acc2_inst06,
acc2_inst05, acc2_inst04, acc2_inst03, acc2_inst02, acc2_inst01,
acc2_inst00,
loop31_saddr, loop31_saddr_mask, loop31_nu, loop31_step_info, loop31_cnt_value,
loop32_saddr, loop32_saddr_mask, loop32_nu, loop32_step_info, loop32_cnt_value,
loop33_saddr, loop33_saddr_mask, loop33_nu, loop33_step_info, loop33_cnt_value,
loop34_saddr, loop34_saddr_mask, loop34_nu, loop34_step_info, loop34_cnt_value,
acc3_inst15, acc3_inst14, acc3_inst13, acc3_inst12, acc3_inst11,
acc3_inst10, acc3_inst09, acc3_inst08, acc3_inst07, acc3_inst06,
acc3_inst05, acc3_inst04, acc3_inst03, acc3_inst02, acc3_inst01,
acc3_inst00,
loop41_saddr, loop41_saddr_mask, loop41_nu, loop41_step_info, loop41_cnt_value,
loop42_saddr, loop42_saddr_mask, loop42_nu, loop42_step_info, loop42_cnt_value,
acc4_inst07, acc4_inst06, acc4_inst05, acc4_inst04, acc4_inst03,
acc4_inst02, acc4_inst01, acc4_inst00,
dr0, dr1, dr2, dr3, and_val, macaddr, jtop25_0,
  jtop32_00, jtop32_01, jtop32_02, jtop32_03, jtop32_04, jtop32_05, jtop32_06,
  jtop32_07, jtop32_08, jtop32_09, jtop32_10, jtop32_11, jtop32_12, jtop32_13,
  jtop32_14, jtop32_15, jtop32_16, jtop32_17, jtop26_00 } ==
    { ram_wl00, ram_wl01, ram_wl02 , ram_wl03 , ram_wl04, ram_wl05, ram_wl06, ram_wl07,
ram_wl08, ram_wl09, ram_wl10, ram_wl11, ram_wl12, ram_wl13, ram_wl14, ram_wl15,
ram_wl16, ram_wl17, ram_wl18, ram_wl19, ram_wl20, ram_wl21, ram_wl22, ram_wl23,
ram_wl24, ram_wl25, ram_wl26, ram_wl27, ram_wl28, ram_wl29,ram_wl30, ram_wl31,
ram_wl32, ram_wl33, ram_wl34, ram_wl35, ram_wl36, ram_wl37, ram_wl38, ram_wl39,
ram_wl40, ram_wl41, ram_wl42, ram_wl43, ram_wl44, ram_wl45, ram_wl46, ram_wl47,
ram_wl48, ram_wl49, ram_wl50, ram_wl51, ram_wl52, ram_wl53, ram_wl54, ram_wl55,
ram_wl56, ram_wl57, ram_wl58, ram_wl59, ram_wl60, ram_wl61, ram_wl62, ram_wl63 };
```

FIG. 5 ram_wl00 (36bit) -> <6$^{th}$ 6-bit value><5$^{th}$ 6-bit value><4$^{th}$ 6-bit value><3$^{rd}$ 6-bit value><2$^{nd}$ 6-bit value><1$^{st}$ 6-bit value>   ⤴ 610 ram_wl01 (36bit) -> <12$^{th}$ 6-bit value>11$^{th}$ 6-bit value><10$^{th}$ 6-bit value><9$^{th}$ 6-bit value><8$^{th}$ 6-bit value><7$^{th}$ 6-bit value>   ⤴ 611

|  | CLK | SCAN_EN | SCAN_RNW | SCAN_P2 | SCAN_P1 | SCAN_P0 | DI | DQ |
|---|---|---|---|---|---|---|---|---|
| Read Inst RAM | LHL | 1 | 1 | 0 | 0 | 0 | X | Valid |
| Write Inst RAM | LHL | 1 | 0 | 0 | 0 | 0 | Valid | X |
| Read result RAM | LHL | 1 | 1 | 0 | 0 | 1 | X | Valid |
| Write result RAM | LHL | 1 | 0 | 0 | 0 | 1 | Valid | X |
| Read D0 RAM | LHL | 1 | 1 | 0 | 1 | 0 | X | Valid |
| Write D0 RAM | LHL | 1 | 0 | 0 | 1 | 0 | Valid | X |
| Read D1 RAM | LHL | 1 | 1 | 0 | 1 | 1 | X | Valid |
| Write D1 RAM | LHL | 1 | 0 | 0 | 1 | 1 | Valid | X |
| Read SAMP RAM | LHL | 1 | 1 | 1 | 0 | 0 | X | Valid |
| Write SAMP RAM | LHL | 1 | 0 | 1 | 0 | 0 | Valid | X |
| Read Config RAM | LHL | 1 | 1 | 1 | 0 | 1 | X | Valid |
| Write Config RAM | LHL | 1 | 0 | 1 | 0 | 1 | Valid | X |

FIG. 7

PROGRAMMABLE BUILT-IN SELF-TEST ARCHITECTURE

CROSS-REFERENCE TO RELATED APPLICATION(S)

This application claims priority to a provisional application Ser. No. 61/080,623, filed Jul. 14, 2008, which is incorporated herein by reference in its entirety without disclaimer.

FIELD

One or more aspects of the invention generally relate to a programmable built-in self-test ("PBIST") architecture in an integrated circuit.

BACKGROUND

As is known, integrated circuits use built-in self-test ("BIST") circuitry for testing. However, using BIST circuitry for testing memory cells, such as for example thinly-capacitively-coupled thyristor ("TCCT") memory cells, has heretofore not provided sufficient programmability and granularity.

Accordingly, it would be desirable and useful to provide programmable BIST ("PBIST") circuitry for testing TCCT memory cells with enhanced granularity.

BRIEF SUMMARY

One or more aspects of the invention generally relate to a programmable built-in self-test ("PBIST") architecture in an integrated circuit.

An aspect is a test data controller built into an integrated circuit for testing an array of memory cells of the integrated circuit. An interface is for receiving expected result data for a test. The interface is further for receiving address information and control information for writing and reading the expected result data respectively to and from a tile of the array of memory cells and result memory. A data path circuit is coupled to the array of memory cells and coupled to the tile. The data path circuit is configured to read the expected result data stored in the tile and configured to read the expected result data stored in the result memory. The data path circuit is further configured for bit-to-associated bit comparisons of the expected result data read from the tile with the expected result data read from the result memory. The data path circuit is coupled to first failure memory and coupled to second failure memory. The data path circuit is configured to write a first type of failure indication to the first failure memory responsive to a data 0 being read from the result memory and a data 1 being read from the tile for a bit-to-associated bit comparison failure. The data path circuit is further configured to write a second type of failure indication to the second failure memory responsive to a data 1 being read from the result memory and a data 0 being read from the tile for the bit-to-associated bit comparison.

Another aspect is a method for testing. High-temperature operating life testing is initiated. Instruction memory is programmed within instructions. A first tile associated with a tile address is first tested with programmable built-in self-test ("PBIST") circuitry responsive to the instructions programmed into the instruction memory. The tile address is incremented responsive to completion of the testing of the first tile to provide an incremented tile address. As part of the programming and the first testing, the PBIST circuitry receives address information, control information, and expected result data. The address information includes the tile address. Also as part of the programming and the first testing, the PBIST circuitry writes the expected result data respectively to the first tile of an array of memory cells and to result memory; reads the expected result data respectively from the first tile and from the result memory; and compares bit-to-associated bit comparisons the expected result data read from the first tile with the expected result data read from the result memory.

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 3 is a pseudocode listing depicting an exemplary embodiment of an architecture for loop and access instructions, namely PBIST instructions.

FIG. 4 is a table diagram depicting an exemplary embodiment of op codes for an access instruction contained in the PBIST instructions of FIG. 3.

FIG. 5 is a pseudocode listing depicting an exemplary embodiment of an instruction memory map for the PBIST instructions and associated system configuration bits of FIGS. 1 and 3.

FIG. 6 is a pseudocode listing depicting an exemplary embodiment of bit values formats in an instruction memory array.

FIG. 7 is a table diagram depicting an exemplary embodiment of a scan signal table that may be used to access different memory arrays in a PBIST engine.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different. Moreover, for purposes of clarity, a single signal or multiple signals may be referred to or illustratively shown as a signal to avoid encumbering the description with multiple signal lines. Moreover, along those same lines, a multiplexer or a register, among other circuit elements, may be referred to or illustratively shown as a single multiplexer or a single register though such reference or illustration may be representing multiples thereof. Furthermore, though particular signal bit widths, data rates, and frequencies are described herein for purposes of clarity by way of example, it should be understood that the scope of the description is not limited to these particular numerical examples as other values may be used. Additionally, even though random access memory ("RAM") is described herein as a type of memory that may be used, it should be understood that other types of storage circuits may be used such as flip-flop arrays, among others. Moreover, even though RAM is described herein, such RAM is not limited to a type of DRAM or SRAM, but may include other forms of RAM, such as flash memory, among others.

Figures 1, 2:
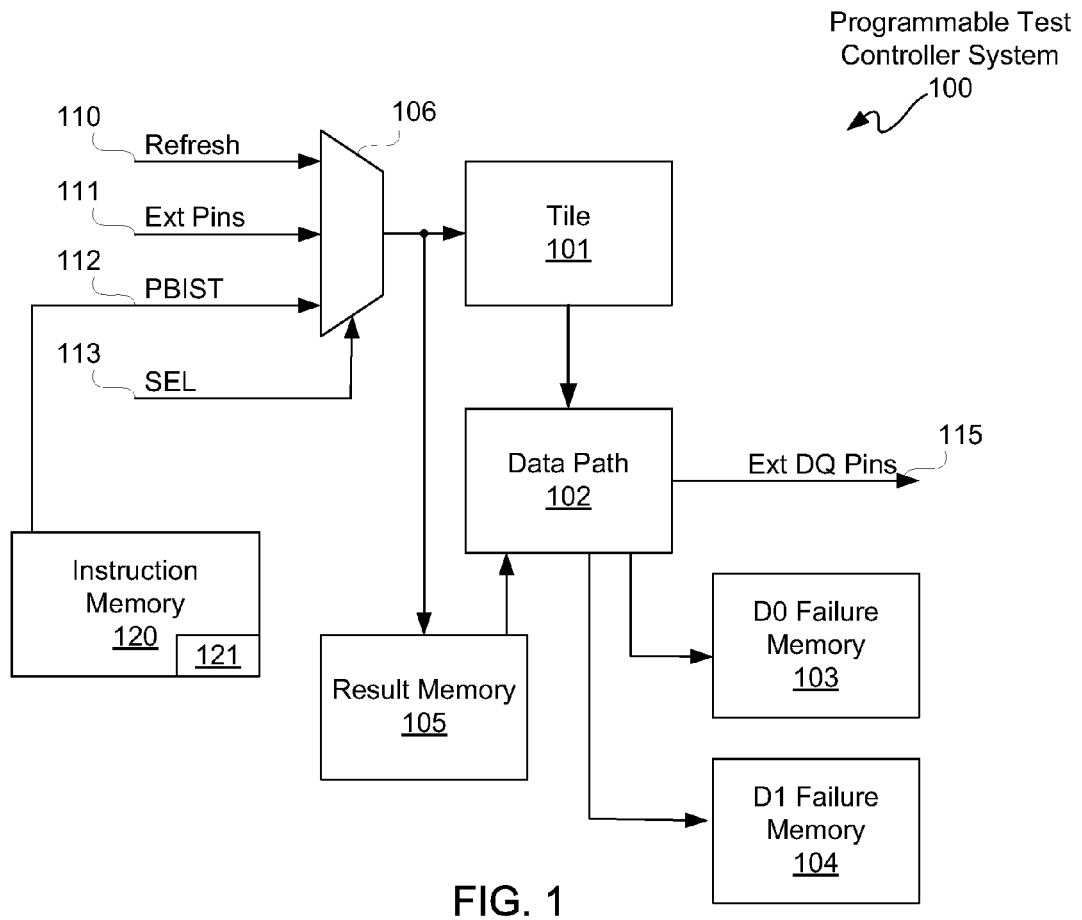
FIG. 1 is a block diagram depicting an exemplary embodiment of a programmable test controller system.
FIG. 2 is a table diagram depicting an exemplary embodiment of operation ("op") codes for a loop instruction.

FIG. 1 is a block diagram depicting an exemplary embodiment of a programmable test controller system 100. Programmable test controller system 100 is generally for performing programmable built-in self-testing ("PBIST") as described herein. System 100 may be built into an integrated circuit device ("on-chip"). System 100 may thus be understood as an on-chip pattern generator for testing a tile, such as tile 101. Thus, while in use for testing, tile 101 forms part of system 100; however, when not in use for testing, tile 101 does not form part of system 100. However, for purposes of clarity by way of example and not limitation, it shall be assumed that tile 101 is part of system 100.

System 100 includes a tile under test, namely tile 101, which in this exemplary embodiment may be an array of memory cells. More particularly, tile 101 may be a sub-array of thinly-capacitively-coupled thyristor ("TCCT") memory cells. TCCT memory cells are known, such as described for example in U.S. Pat. No. 6,778,435, among other patents, and thus are not described in unnecessary detail herein.

An array of TCCT memory cells may be composed of multiple sub-arrays or tiles. Thus, each tile 101 of an array of memory cells may be tested one at a time using PBIST of system 100. For purposes of clarity, array and sub-array are hereinafter used interchangeably.

For tiles in a device, a data path 102 is configured to read array data from a tile 101 and is configured to compare such TCCT array data with expected data associated with such array data read to produce outcome data responsive to each such comparison. Outcome data may be sorted into two types, namely a result for a comparison to an expected logic 0, and a result for a comparison to an expected logic 1. Mismatches between expected logic 0s and associated TCCT array data logic 1s are termed data 0 ("D0") outcome failures, and mismatches between expected logic 1s and associated TCCT array data logic 0s are termed data 1 ("D1") failures. Additionally, external data output pins 115 may be coupled to data path 102 for output of comparison results.

D0 failures are stored in D0 failure memory 103, and D1 failures are stored in D1 failure memory 104. Result memory 105 stores expected data which is compared with data read from each TCCT array tested. Any form of memory suitable for the purposes described herein may be used for result memory 105, including TCCT memory, any form of RAM, flip-flop memory, and other known types of memory.

Multiplexer 106 may be used to select a source for address information, control information, and data. Address information, control information, and data can be from a refresh engine via signaling 110, can be externally provided from off-chip via external input pins ("Ext Pins") via signaling 111, or can be provided on-chip from PBIST circuitry via signaling 112.

Thus, multiplexer 106 has three input ports, namely for receiving refresh signaling 110, external input pins signaling 111, and PBIST signaling 112. PBIST signaling 112 may be responsive to instructions from an instruction file 121, as described below in additional detail. Such an instruction file 121 may be stored in instruction memory 120, which may be on-chip memory. Responsive to select signaling 113, multiplexer 106 provides selected signaling of signals 110 through 112 as an input to both tile 101 and result memory 105.

Control information, address information, and/or data selectively output from multiplexer 106 forms a read or a write transaction. The read transaction causes a read of TCCT array data of tile 101 and a read of expected result data for such TCCT array data from result memory 105. Outputs of each of such reads is provided to data path 102, and data path 102 includes circuitry configured to compare such TCCT array data and associated expected result data bit-by-bit. If a comparison fails, the result is either a D0 failure or a D1 failure. If a comparison is a D0 failure, the result of such comparison goes to D0 failure memory 103, and if a comparison is D1 failure, the result of such comparison goes to D1 failure memory 104.

If control information, address information, and data selectively output from multiplexer 106 forms a write transaction, a portion of such data is written to a TCCT memory cell array of tile 101 and another portion of such data is written to result memory 105. Such portions of data may be compared with one another as respective sets of read data, as previously described.

PBIST access transactions resulting from PBIST instructions may be provided to system 100 via PBIST signaling 112. PBIST instructions may generally include two types of instructions: loop instructions and access instructions.

FIG. 2 is a table diagram depicting an exemplary embodiment of operation ("op") codes 200 for a loop instruction. Op codes 200 may be for a loop instruction contained in PBIST instructions 300 of FIG. 3. Op codes 200 may include a start address, a mask for the start address, a data same as address flag, an address decrement or increment, a step size (i.e., how much to decrement or increment), and a number of steps (i.e., how many times a loop is to be executed).

FIG. 3 is a pseudocode listing depicting an exemplary embodiment of an architecture for loop and access instructions, namely an exemplary embodiment of PBIST instructions 300. PBIST instructions 300 include an initial two-level loop 310, two four-level loops 320 and 330, and another two-level loop 340. Accordingly, it should be understood that access instructions are nested within loops, and loops may be nested within other loops.

Each of loops 310 through 340 executes access instruction information according to loop instruction values. Thus, address information for access instructions, whether reads or writes, is obtained from loop instructions. If an access instruction is not valid then the instruction is skipped.

FIG. 4 is a table diagram depicting an exemplary embodiment of op codes 400 for an access instruction. Op codes 400 may be for an access instruction contained in PBIST instructions 300 of FIG. 3. Op codes 400 may include a valid instruction (if not valid the instruction is skipped), a read/write enable, a read not write enable, a port A or B loop address, an execute once or execute n times (e.g., a counter instruction), an address invert for port A operation, a dummy read (e.g., a read for which comparison by data path 102 is disabled) for port A instruction, a flag ("X") value, a write invert operation, a data invert for writes and an address invert for reads for port B instruction, a dummy read for port B instruction, a write data register instruction, an add current address pointer instruction, and an add current loop with pointer operation.

In this exemplary embodiment for system 100 of FIG. 1, there are two read ports and one write port; however, in other embodiments system 100 may have more than two read ports and more than one write port, which may more generally be thought of as k read ports and m write ports for k and m positive integers greater than 1. Additionally, it should be understood that each PBIST instruction is like a Very Long Instruction Word ("VLIW") instruction in that each PBIST instruction is capable of causing execution of a plurality of operations in parallel.

FIG. 5 is a pseudocode listing depicting an exemplary embodiment of an instruction memory map 500 for PBIST instructions 300 of FIG. 3 and bits for configuration of system 100 of FIG. 1. Again, even though RAM is referenced in FIG. 5, it should be understood that other types of memory may be used in accordance with the description herein, including without limitation flip-flop array memory.

FIG. 6 is a pseudocode listing depicting an exemplary embodiment of bit values formats 610 and 611. Formats 610 and 611 are for an instruction file, such as having loop and access instructions as described herein. Instruction file formats 610 and 611 are for loading an instruction file into a chip for execution by programmable test controller system 100 of FIG. 1. Even though only two examples of instruction file formats are illustratively shown in FIG. 6, it should be understood that more than two of such formats may be included as part of an instruction file, and may be extensions of the format structure of formats 610 and 611. A bit value format may be the same for instruction, result, D0, and D1 memories. Again, even though RAM is referenced in FIG. 6, it should be understood that other types of memory may be used in accordance with the description herein, including without limitation flip-flop array memory.

FIG. 7 is a table diagram depicting an exemplary embodiment of a scan signal table 700 that may be used to access different memory arrays in a PBIST engine. Scan signals 723 through 729 are used to load/store data into memory. Again, even though RAM is referenced in FIG. 7, it should be understood that other types of memory may be used in accordance with the description herein, including without limitation flip-flop array memory.

Scan signal table 700 indicates the status of reads and writes. Column 721 indicates whether the operation for memory being scanned is a read or a write and the nature of the operation. Column 722 indicates the operation of the clock signaling for each associated operation. Columns 723 through 727 indicate the respective logic high or logic low levels of the various scan signals, namely scan enable signal in column 723, scan read not write signal in column 724, scan P2 signal in column 725, scan P1 signal in column 726, and scan P0 signal in column 727. P0, P1 and P2 in combination form a 3 bit port address. Columns 728 and 729 indicate whether the data input ("DI") and data output ("DQ"), respectively, are valid ("Valid") or don't care as flagged by X.

Figure 8:
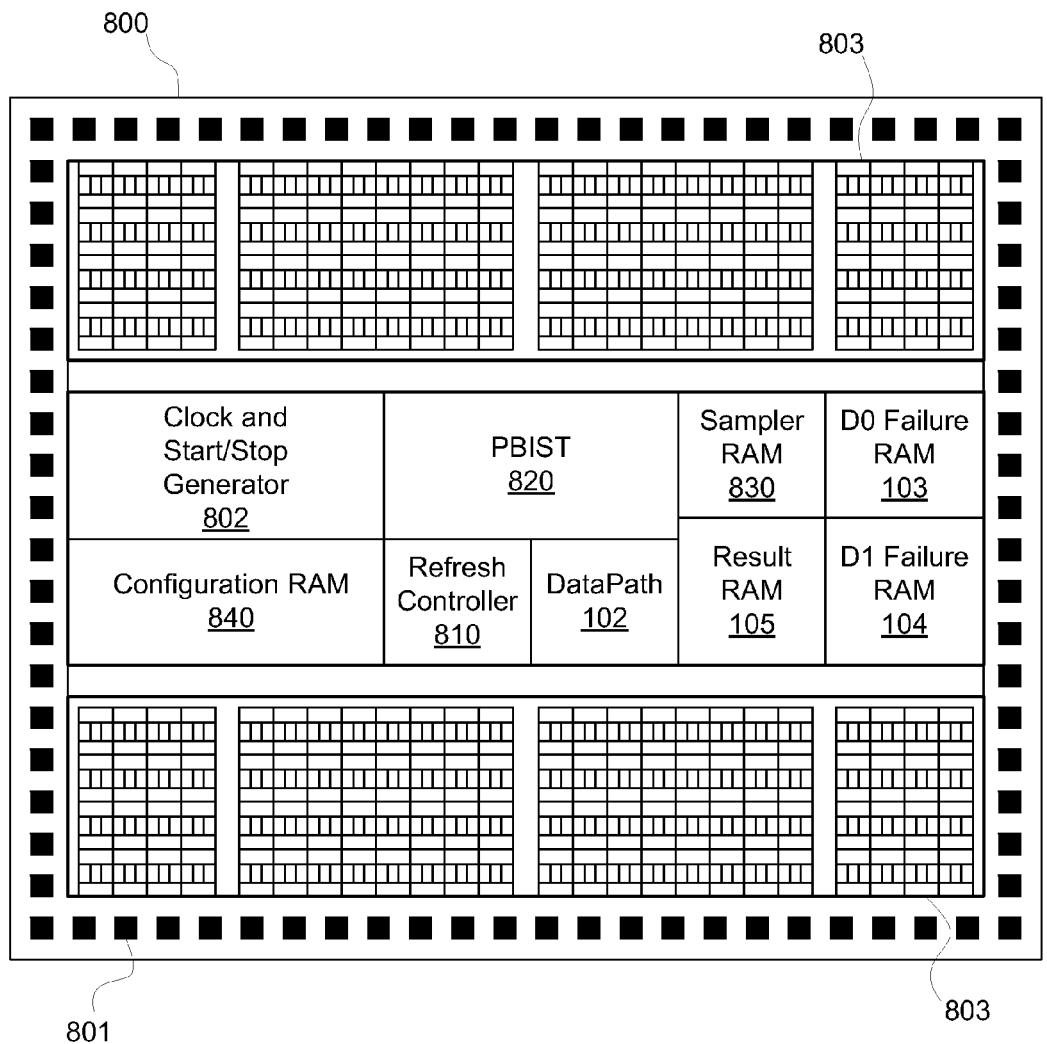
FIG. 8 is a block diagram depicting an exemplary embodiment of an integrated circuit architecture in which the system of FIG. 1 may be implemented.

FIG. 8 is a block diagram depicting an exemplary embodiment of an integrated circuit architecture 800 in which system 100 of FIG. 1 may be implemented. Again, even though RAM is referenced in FIG. 8, it should be understood that other types of memory may be used in accordance with the description herein, including without limitation flip-flop array memory.

Architecture 800 may include a ring of pads 801 for connection to pins, a clock and start/stop generator 802, a refresh engine or controller 810, data path 102, memories 103 through 105, sampler RAM 830, configuration RAM 840, and instruction memory with PBIST instructions, namely included within PBIST block or engine 820. Each array section 803 of TCCT memory cells may have p, for p a positive integer, number of tiles for being tested one at a time as tiles 101. Clock and start/stop generator 802 provides the timing for TCCT memory cells of sections 803. Sampler RAM 830 is for sample storage of the signals from the boundary of tile 101. Reads and writes to instruction memory 120 of FIG. 1 (not shown in FIG. 8) of PBIST engine 820, sampler RAM 830, configuration RAM 840, and memories 103 through 105 may be performed and monitored in scan signal table 700 of FIG. 7.

There are two kinds or modes of refreshes supported by system 100. First, system 100 may refresh while PBIST signaling 112 of FIG. 1 is executing ("internal refresh"). An internal refresh may be initiated when an internal counter of system 100 reaches a threshold count ("expires"). An internal refresh halts internal PBIST accesses. In the burst mode, a tile, represented by an instruction file, for such halted PBIST access is refreshed, and after completion of refreshing such tile, control is passed back to system 100. Externally, system 100 may suspend this internal refresh by taking an external pin low.

Second, system 100 supports a refresh during external accesses ("external refresh"). An external refresh may be initiated externally, keeping time that defines after how long refresh is to be performed, in view. This external refresh may be initiated by keeping an external reference pin, namely "PIN_EXTREF", high for a number clock signal cycles, such as 128 cycles in this embodiment.

Figure 9:
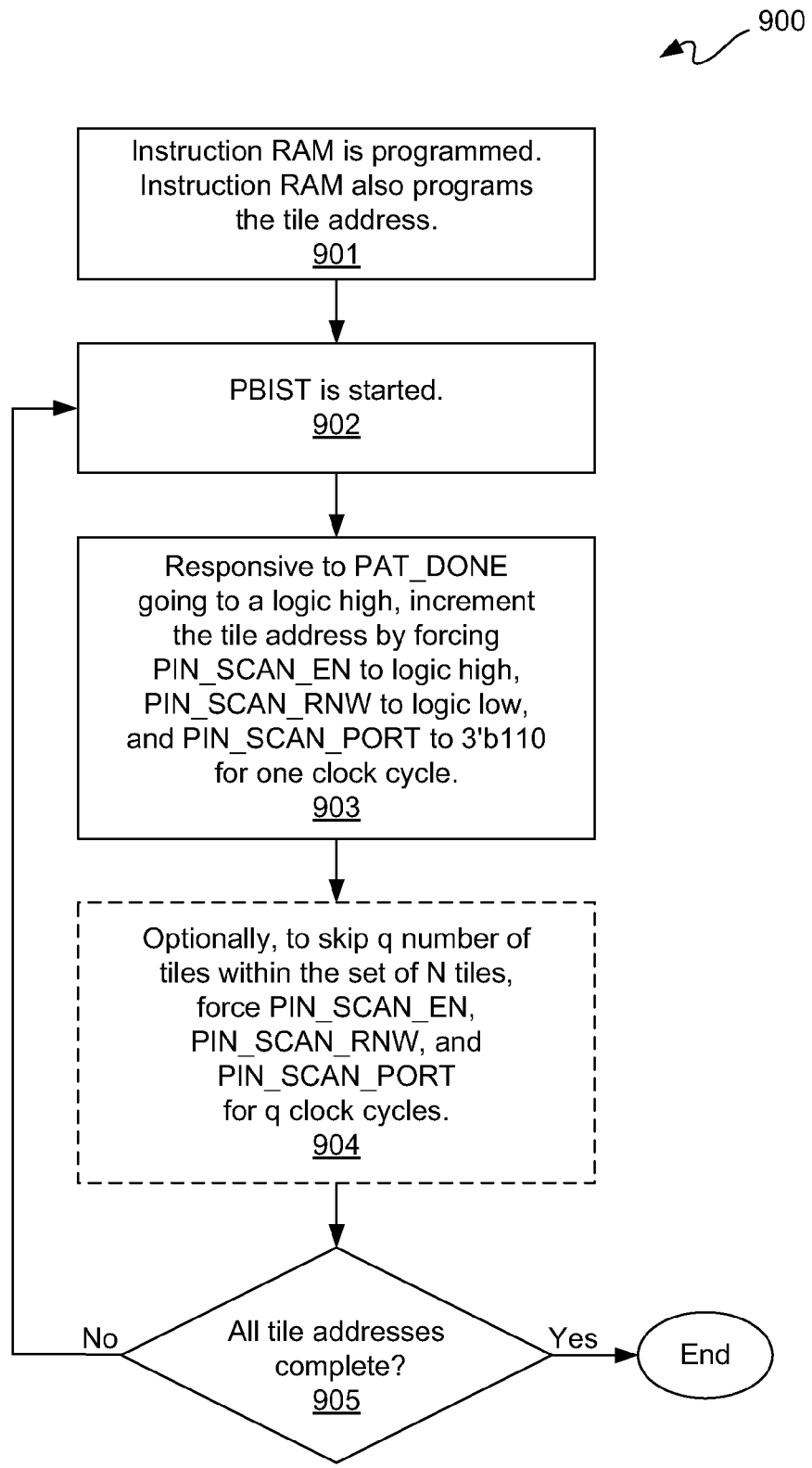
FIG. 9 is a flow diagram depicting an exemplary embodiment of a burn-in or high-temperature operating life ("HTOL") testing flow describing the system of FIG. 1 under operation while doing burn-in or high-temperature operating life testing.

FIG. 9 is a flow diagram depicting an exemplary embodiment of burn-in (BI) or high-temperature operating life ("HTOL") testing flow 900. BI/HTOL testing flow 900 describes system 100 under operation while doing burn-in or high-temperature operating life testing. Again, even though RAM is referenced in FIG. 9, it should be understood that other types of memory may be used in accordance with the description herein, including without limitation flip-flop array memory.

At 901, instruction memory is programmed. Instruction memory also programs a tile address. At 902, testing is started responsive to PBIST instructions programmed into the instruction memory at 901.

At 903, the tile address programmed at 901 is incremented responsive to a logic high being asserted by a test done signal, such as a PAT DONE signal, which indicates that a PBIST operation is completed for one tile 101 associated with the tile address programmed at 901. The tile address may be incremented by forcing an activation signal, such as a PIN_SCAN_EN signal, to a logic high level, a read not write scan signal, such as a PIN_SCAN_RNW signal, to a logic low level, and a port scan signal, such as a PIN_SCAN_PORT signal, to a value for one clock cycle. The tile address LSBs are incremented at 903, which in this example are bits [3:0] though another number of LSBs may be used.

At 904, q, for q a positive integer, tiles within a set, namely a set of N tiles in this embodiment, may optionally be skipped by forcing PIN_SCAN_EN, PIN_SCAN_RNW, and PIN_SCAN_PORT for q clock cycles. Accordingly, not all N tiles 101 may be tested in an embodiment. In this embodiment, N is equal to 16; however, the total number of tiles may be less than or greater than 16.

At 905, it is determined whether all tile addresses have been incremented. If all tile addresses have been incremented, BI/HTOL testing flow 900 terminates. If all tile addresses have not been incremented, BI/HTOL testing flow 900 returns to 902 for as many iterations of the PBIST as may be involved to increment all tile addresses for testing all the tiles, assuming the option of skipping one or more tiles has not been invoked.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A test data controller built into an integrated circuit for testing an array of memory cells of the integrated circuit, comprising:
   an interface for receiving expected result data for a test;
   the interface further for receiving address information and control information for writing and reading the expected result data respectively to and from a tile of the array of memory cells and result memory;
   a data path circuit coupled to the array of memory cells and coupled to the tile;
   the data path circuit configured to read the expected result data stored in the tile and configured to read the expected result data stored in the result memory;
   the data path circuit further configured for bit-to-associated bit comparisons of the expected result data read from the tile with the expected result data read from the result memory;
   the data path circuit coupled to first failure memory and coupled to second failure memory;
   the data path circuit configured to write a first type of failure indication to the first failure memory responsive to a data 0 being read from the result memory and a data 1 being read from the tile for a bit-to-associated bit comparison failure; and
   the data path circuit further configured to write a second type of failure indication to the second failure memory responsive to a data 1 being read from the result memory and a data 0 being read from the tile for the bit-to-associated bit comparison.

2. The test data controller according to claim 1, wherein the tile is a sub-array of thinly-capacitively-coupled thyristor ("TCCT") memory cells.

3. The test data controller according to claim 1, wherein the address information, the control information, and the expected result data are read from a refresh controller.

4. The test data controller according to claim 1, wherein:
   the address information, the control information, and the expected result data are read from programmable built-in self-test ("PBIST") circuitry;
   the PBIST circuitry includes memory for storing an instruction file;
   the instruction file includes PBIST instructions; and
   the PBIST instructions cause PBIST access transactions to be provided to the data path circuitry via the interface.

5. The test data controller according to claim 4, wherein:
   the PBIST instructions include access instructions nested within loop instructions; and
   the PBIST instructions further include a portion of the loop instructions nested within another portion of the loop instructions.

6. The test data controller according to claim 5, wherein:
   the access instructions are executed responsive to address values of the loop instructions associated therewith; and
   the access instructions include write instructions and read instructions.

7. The test data controller according to claim 5, wherein the access instructions are for multiple ports for parallel execution of multiple operations associated with the access instructions.

8. The test data controller according to claim 7, further comprising a scan signal table for indicating status of reads and writes of the parallel execution of multiple operations.

9. The test data controller according to claim 7, further comprising a refresh engine configured for an internal refresh mode and an external refresh mode.

10. The test data controller according to claim 9, wherein the internal refresh halts a PBIST access.

11. The test data controller according to claim 10, wherein in a burst mode, the tile is represented by an instruction file for the PBIST access; and wherein the tile is refreshed.

12. A method for testing, comprising:
   initiating high-temperature operating life testing;
   programming instruction memory with in instructions;
   first testing a first tile associated with a tile address with programmable built-in self-test ("PBIST") circuitry responsive to the instructions programmed into the instruction memory;
   incrementing the tile address responsive to completion of the testing of the first tile to provide an incremented tile address; and
   the PBIST circuitry as part of the programming and the first testing:
      receiving address information, control information, and expected result data;
      the address information including the tile address;
      writing the expected result data respectively to the first tile of an array of memory cells and to result memory;
      reading the expected result data respectively from the first tile and from the result memory; and
      comparing bit-to-associated bit the expected result data read from the first tile with the expected result data read from the result memory;
      for a first type of failure:
         writing a first type of failure indication for the first type of failure to first failure memory;
         wherein the first type of failure is for a data 0 being read from the result memory and a data 1 being read from the first tile for a first bit-to-associated bit comparison;
      for a second type of failure:
         writing a second type of failure indication to second failure memory;
         wherein the second type of failure is for a data 1 being read from the result memory and a data 0 being read from the first tile for a second bit-to-associated bit comparison.

13. The method according to claim 12, further comprising:
   second testing a second tile associated with the incremented tile address with the PBIST circuitry responsive to the instructions programmed into the instruction memory;
   with the second tile instead of the first tile, repeating with the PBIST circuitry as part of the programming and the second testing: the receiving, the writing of the expected result data, the reading of the expected result data, the comparing, the writing of the first type of failure indication, and the writing of the second type of failure indication.

14. The method according to claim 13, wherein the array of memory cells is an array of thinly-capacitively-coupled thyristor memory cells.

* * * * *